United States Patent
Lee et al.

(10) Patent No.: US 8,673,674 B2
(45) Date of Patent: Mar. 18, 2014

(54) ORGANIC LIGHT EMITTING DIODE DISPLAY DEVICE AND METHOD OF FABRICATING THE SAME

(71) Applicants: Hong-Ro Lee, Yongin (KR); Sang-Jo Lee, Yongin (KR)

(72) Inventors: Hong-Ro Lee, Yongin (KR); Sang-Jo Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/959,528

(22) Filed: Aug. 5, 2013

(65) Prior Publication Data
US 2013/0316474 A1 Nov. 28, 2013

Related U.S. Application Data

(62) Division of application No. 12/710,159, filed on Feb. 22, 2010, now Pat. No. 8,502,809.

(30) Foreign Application Priority Data

Oct. 15, 2009 (KR) ........................ 10-2009-0098137

(51) Int. Cl.
| | | |
|---|---|---|
| H01L 27/32 | (2006.01) | |
| H01L 51/56 | (2006.01) | |
| H01L 27/12 | (2006.01) | |
| H01L 51/50 | (2006.01) | |

(52) U.S. Cl.
CPC ........ H01L 27/1214 (2013.01); H01L 27/3262 (2013.01); H01L 51/5012 (2013.01); H01L 51/56 (2013.01)

USPC ................. 438/59; 257/40; 257/89; 257/444; 349/43; 438/150; 438/152; 438/166; 438/487; 438/82

(58) Field of Classification Search
CPC .......... H01L 51/52; H01L 51/50; H01L 51/56
USPC ............................................... 257/88; 438/82
See application file for complete search history.

(56) References Cited

U.S. PATENT DOCUMENTS

| | | | |
|---|---|---|---|
| 7,265,737 B2 | 9/2007 | Koo et al. | |
| 7,804,466 B2 * | 9/2010 | Kwak et al. | 345/76 |
| 7,825,880 B2 * | 11/2010 | Yumoto et al. | 345/77 |
| 8,232,986 B2 * | 7/2012 | Kim et al. | 345/213 |
| 8,395,564 B2 * | 3/2013 | Shin et al. | 345/76 |
| 8,462,089 B2 * | 6/2013 | Han et al. | 345/82 |
| 2006/0152644 A1 | 7/2006 | Yi | |
| 2008/0024413 A1 | 1/2008 | Minami et al. | |

FOREIGN PATENT DOCUMENTS

| | | |
|---|---|---|
| JP | 09-260681 | 10/1997 |
| JP | 09-321310 | 12/1997 |
| JP | 2003-150082 | 5/2003 |
| JP | 2003-197630 | 7/2003 |
| JP | 2005-031630 | 2/2005 |
| KR | 10-2010-0021311 | 2/2010 |

* cited by examiner

*Primary Examiner* — Olik Chaudhuri
*Assistant Examiner* — Nicholas Tobergte
(74) *Attorney, Agent, or Firm* — Christie, Parker & Hale, LLP

(57) ABSTRACT

An organic light emitting diode (OLED) display device and a method of fabricating the same is provided. Semiconductor layers of driving transistors located in two adjacent pixels included in the OLED display device may extend in different lengthwise directions. Thus, striped stains of the OLED display device can be improved.

20 Claims, 3 Drawing Sheets

ORGANIC LIGHT EMITTING DIODE DISPLAY DEVICE AND METHOD OF FABRICATING THE SAME

CROSS-REFERENCE TO RELATED APPLICATIONS

This application is a divisional of U.S. application Ser. No. 12/710,159, filed on Feb. 22, 2010, which claims priority to and the benefit of Korean Patent Application No. 10-2009-0098137, filed in the Korean Intellectual Property Office on Oct. 15, 2009, the entire contents of all of which are incorporated herein by reference.

BACKGROUND

1. Field

Example embodiments of the present invention relate to an organic light emitting diode (OLED) display device and a method of fabricating the same.

2. Description of the Related Art

An organic light emitting diode (OLED) display device, which is a type of flat panel display (FPD), may have a higher luminance and a wider viewing angle than a liquid crystal display (LCD). In addition, the OLED display device does not require a backlight unit and thus, the OLED display device may be made very thin.

OLED display devices may be classified as a passive-matrix type or an active-matrix type depending on the driving method. An active-matrix OLED display device may include a circuit using a thin film transistor (TFT). In addition, although a semiconductor layer of the TFT may be obtained using a polycrystalline silicon (poly-Si) layer crystallized with laser beams, defects such as striped stains may be generated during a crystallization process.

SUMMARY

Non-limiting example embodiments of the present invention provide for an organic light emitting diode (OLED) display device and a method of fabricating the same, which may reduce or minimize striped stains caused by factors such as output nonuniformity of oscillation laser beams of a laser irradiation apparatus, and without reducing manufacturing productivity of the devices.

According to a non-limiting example embodiment of the present invention, an organic light emitting diode (OLED) display device is provided. The OLED display device includes a plurality of scan lines, a plurality of data lines crossing the scan lines, and a plurality of pixels at crossing regions of the scan lines and the data lines. Each of the pixels includes an OLED, a switching transistor, a driving transistor, and a capacitor. The switching transistor includes a gate electrode coupled to one of the scan lines and a first electrode coupled to one of the data lines. The driving transistor is coupled between the OLED and a power voltage supply line and includes a semiconductor layer and a gate electrode coupled to a second electrode of the switching transistor. The capacitor is coupled between the gate electrode of the driving transistor and the power voltage supply line. The semiconductor layers of the driving transistors of two adjacent pixels from among the plurality of pixels that are located along the scan lines or the data lines extend in different lengthwise directions.

The switching transistor may further include a semiconductor layer. The semiconductor layer of each of the switching transistor and the driving transistor may include source and drain regions and a channel region. The gate electrode of each of the switching transistor and the driving transistor may be in a location corresponding to the channel region of the semiconductor layer. Each of the switching transistor and the driving transistor may further include source and drain electrodes and a gate insulating layer. The source and drain electrodes may respectively couple to the source and drain regions of the semiconductor layer. The gate insulating layer may be between the semiconductor layer and the gate electrode.

The switching transistor and the driving transistor may have a same structure.

The semiconductor layers of the driving transistors of two adjacent pixels along the scan lines or the data lines from among the plurality of pixels may extend in different lengthwise directions. Angle differences between the lengthwise directions of the semiconductor layers of the driving transistors of any two of the adjacent pixels having different lengthwise directions may be substantially the same as each other.

The semiconductor layers of the driving transistors of substantially any two adjacent pixels from among the plurality of pixels that are located along the scan lines or the data lines may extend in different lengthwise directions.

The semiconductor layer of the switching transistor and the semiconductor layer of the driving transistor may be formed using polycrystalline silicon (poly-Si) crystallized using laser beams.

The semiconductor layer of the switching transistor and the semiconductor layer of the driving transistor may have crystal grain boundaries formed parallel to the scan lines or the data lines.

The semiconductor layers of the driving transistors of substantially any two adjacent pixels from among the plurality of pixels that are located along the scan lines or the data lines may extend in different lengthwise directions.

According to another non-limiting example embodiment of the present invention, an organic light emitting diode (OLED) display device is provided. The OLED display device includes a plurality of pixels located at crossing regions of a plurality of data lines through which data signals are transmitted from a data driver and a plurality of scan lines through which scan signals are transmitted from a scan driver. Each of the pixels includes an OLED controlled by a plurality of thin film transistors (TFTs). Each of the TFTs includes a semiconductor layer, a gate insulating layer, source and drain electrodes, and a gate electrode. The semiconductor layers of the TFTs coupled to the OLEDs of two adjacent pixels from among the plurality of pixels that are located along the scan lines or the data lines extend in different lengthwise directions.

Each of the pixels further may further include a capacitor, a driving transistor from among the TFTs, and a switching transistor from among the TFTs. The capacitor may be configured to store a data signal from among the data signals. The driving transistor may be configured to apply a driving current to the OLED that corresponds to the data signal. The switching transistor may be configured to apply the data signal to a gate terminal of the driving transistor in response to one of the scan signals. The semiconductor layers of the driving transistors of two adjacent pixels from among the plurality of pixels that are located along the scan lines or the data lines may extend in different lengthwise directions.

The semiconductor layers of the TFTs coupled to the OLEDs of two adjacent pixels along the scan lines or the data lines from among the plurality of pixels may extend in different lengthwise directions. Angle differences between the lengthwise directions of the semiconductor layers of the TFTs coupled to the OLEDs of any two of the adjacent pixels having different lengthwise directions may be substantially the same as each other.

The semiconductor layers of the TFTs coupled to the OLEDs of substantially any two adjacent pixels from among the plurality of pixels that are located along the scan lines or the data lines may extend in different lengthwise directions.

The semiconductor layers of the TFTs may be formed using polycrystalline silicon (poly-Si) crystallized using laser beams.

The semiconductor layers of the TFTs may have crystal grain boundaries formed parallel to the scan lines or the data lines.

The semiconductor layers of the TFTs coupled to the OLEDs of substantially any two adjacent pixels from among the plurality of pixels that are located along the scan lines or the data lines may extend in different lengthwise directions.

According to yet another non-limiting example embodiment of the present invention, a method of fabricating an organic light emitting diode (OLED) display device is provided. The OLED display device includes a substrate, a plurality of data lines, a plurality of scan lines, and a plurality of pixels at crossing regions of the data lines and the scan lines. The method includes forming a switching transistor and a driving transistor on the substrate for each of the pixels. The switching transistor includes a first semiconductor layer, a gate insulating layer, first and second source/drain electrodes, and a first gate electrode. The driving transistor includes a second semiconductor layer, a gate insulating layer, third and fourth source/drain electrodes, and a second gate electrode. The method further includes forming each of the scan lines coupled to the first gate electrode of the switching transistor of respective pixels from among the plurality of pixels, and each of the data lines coupled to the first source/drain electrode of the switching transistor of respective pixels from among the plurality of pixels. The method further includes forming a protection layer on the switching transistor and the driving transistor of each of the pixels. The method further includes forming, for each of the pixels, an OLED comprising a lower electrode coupled to the fourth source/drain electrode of the driving transistor, an organic layer comprising at least one emission layer (EML), and an upper electrode on the protection layer. The second semiconductor layers of two adjacent pixels from among the plurality of pixels that are located along the scan lines or the data lines extend in different lengthwise directions.

The first and second semiconductor layers may be formed by crystallizing amorphous silicon (a-Si) into polycrystalline silicon (poly-Si) using laser beams.

The laser beams used to crystallize the a-Si may be irradiated in a direction parallel to the scan lines or the data lines.

The second semiconductor layers of two adjacent pixels along the scan lines or the data lines from among the plurality of pixels may extend in different lengthwise directions. Angle differences between the lengthwise directions of the second semiconductor layers of the driving transistors of any two of the adjacent pixels having different lengthwise directions may be substantially the same as each other.

The method may further include forming a planarization layer on the protection layer.

BRIEF DESCRIPTION OF THE DRAWINGS

The above and other features of the present invention will be described in reference to certain non-limiting example embodiments thereof with reference to the attached drawings in which.

DETAILED DESCRIPTION

Figure 1:
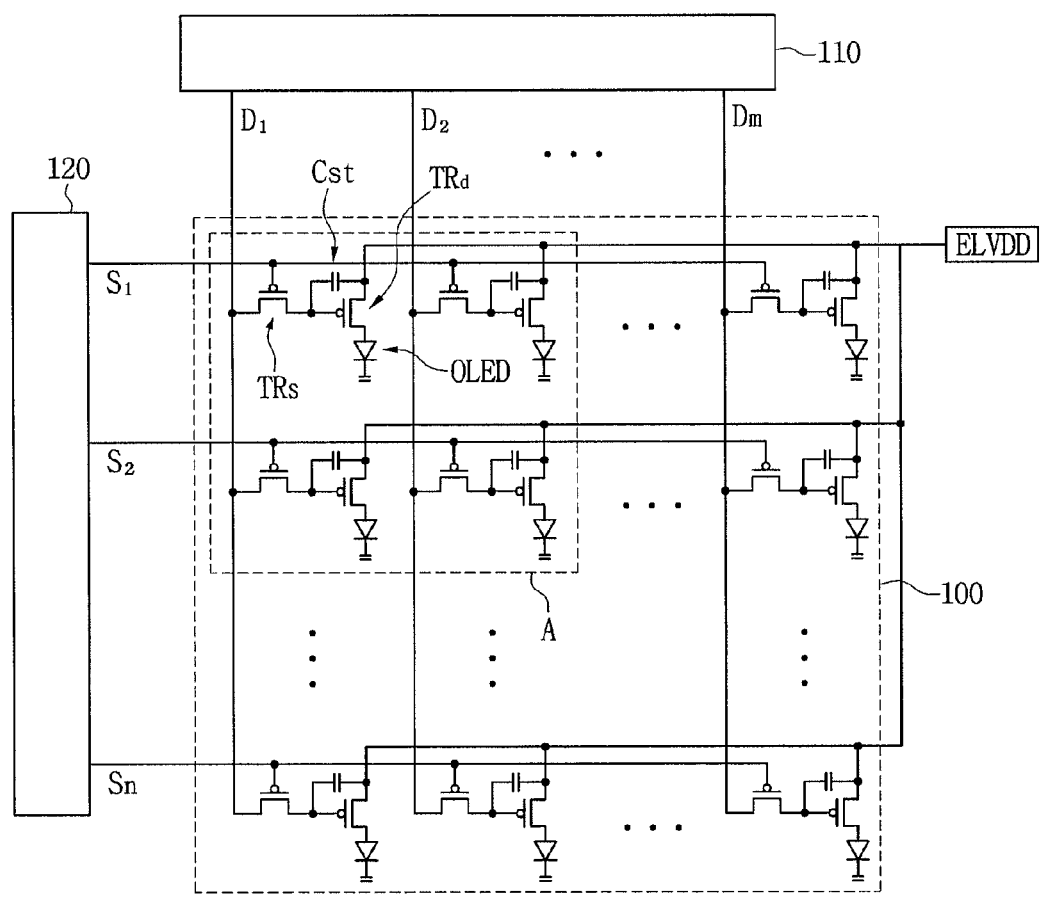
FIG. 1 is a circuit diagram of an organic light emitting diode (OLED) display device according to a non-limiting example embodiment of the present invention.

The foregoing and other features and aspects of the invention will be apparent from the more particular description of non-limiting example embodiments of the invention, as illustrated in the accompanying drawings. In the drawings, the thicknesses of layers or regions may be exaggerated for clarity, and the same reference numerals are used to denote the same elements throughout the drawings.

In this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

In consideration of mass production and efficiency when producing organic light emitting diode display devices, a silicon crystallization method using laser beams may involve: outputting beam-spot laser beams using a gas laser oscillator, such as an excimer laser, or a solid laser oscillator, such as a YAG laser; processing the beam-spot laser beams into linear laser beams with a length (e.g., a predetermined length) using an optical system; and irradiating the linear laser beams onto a substrate. However, speckles may occur in major and minor axes of the linear laser beams due to high-interference characteristics of the laser beams, thereby reducing the crystal uniformity of a poly-Si layer formed on the substrate. As a result, striped stains may be formed parallel or perpendicular to a laser irradiation direction.

Furthermore, in order to reduce or minimize the occurrence of striped stains, linear laser beams may be irradiated onto a substrate at different angles (e.g., predetermined angles) so that laser beams and their associated speckles may be irradiated onto the substrate in a scattered or random fashion. However, when the substrate is at different angles (e.g., predetermined angles) with the laser beams, a process time may be increased according to all the different angles between the substrate and the laser beams, and controlling an overlap area between pixels and their different laser beam angles may be difficult. As a result, manufacturing productivity of the devices may be degraded.

Non-Limiting Example Embodiment

Figure 2:
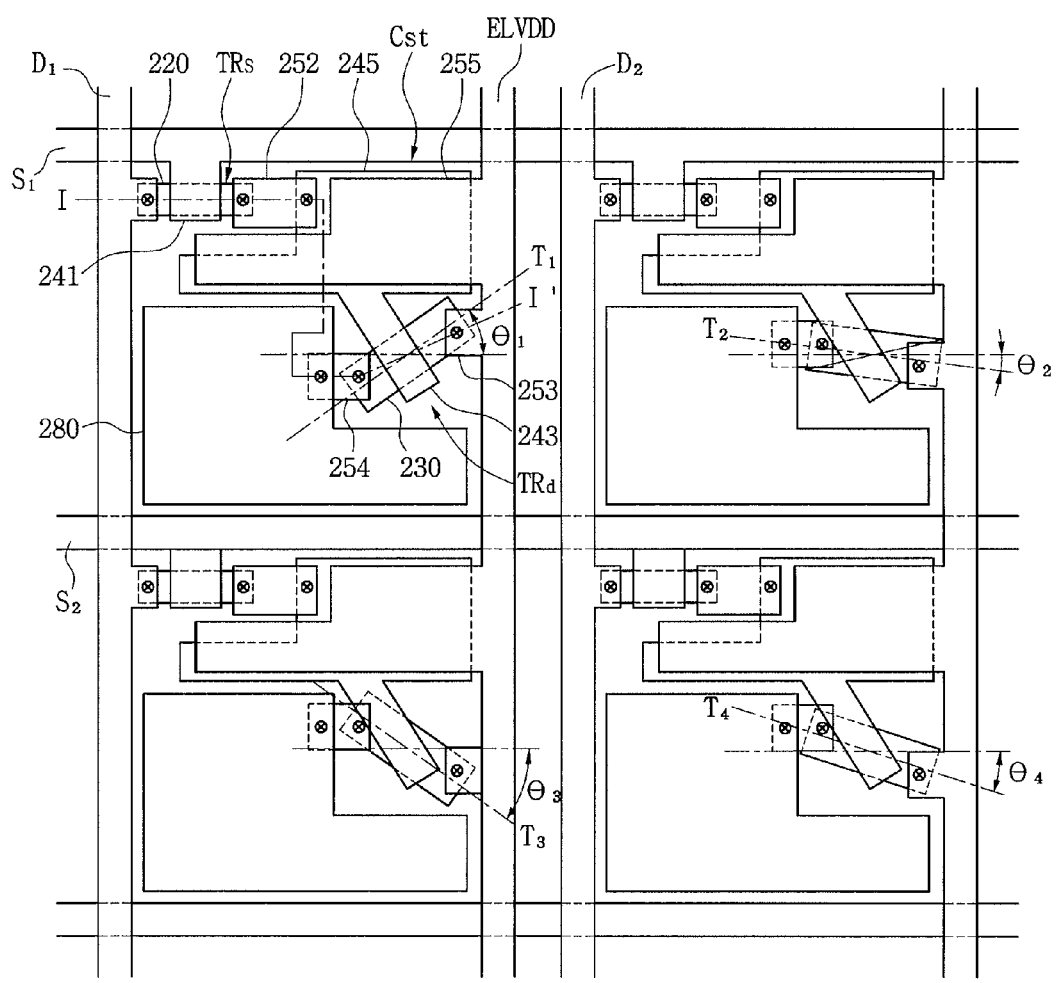
FIG. 2 is a plan view of region "A" of FIG. 1.

FIG. 1 is a circuit diagram of an organic light emitting diode (OLED) display device (i.e., an organic light emitting display device) according to a non-limiting example embodiment of the present invention, and FIG. 2 is a plan view of region "A" of FIG. 1.

Referring to FIGS. 1 and 2, an OLED display device according to a non-limiting example embodiment of the present invention may include a display unit 100, a data driver 110, and a scan driver 120. The display unit 100 may be used to display an image (for example, a predetermined image). The data driver 110 may be used to apply data signals to the display unit 100 through a plurality of data lines D1 to Dm. In addition, the scan driver 120 may be used to apply scan signals to the display unit 100 through a plurality of scan lines S1 to Sn.

Thus, the display unit 100 may be used to display images in response to the scan signals and the data signals. The display unit 100 includes a plurality of pixels located at crossing regions of the data lines D1 to Dm and the scan lines S1 to Sn. Each of the pixels includes an organic light emitting diode (OLED), a switching transistor TRs, a driving transistor TRd, and a capacitor Cst. The switching transistor TRs has a gate electrode 241 coupled to one of the scan lines S1 to Sn and a first electrode coupled to one of the data lines D1 to Dm. The switching transistor TRs may transmit one of the data signals in response to one of the scan signals. The driving transistor TRd is coupled between the OLED and a power voltage supply line ELVDD and has a gate electrode 243 coupled to a second electrode of the switching transistor TRs. The driving transistor TRd may transmit a driving current to the OLED that corresponds to the data signal transmitted through the switching transistor TRs. The capacitor Cst is coupled between the gate electrode 243 of the driving transistor TRd and the power voltage supply line ELVDD and used to store the data signal.

In one non-limiting example embodiment, in two adjacent pixels located along one of the scan lines S1 to Sn or one of the data lines D1 to Dm, a semiconductor layer 230 of the driving transistor TRd is formed to extend in different lengthwise directions, for example, lengthwise directions T1 to T4 shown in FIG. 2, thereby generating variance between the characteristics of the two adjacent pixels located along the scan line or the data line. For the convenience of description, four different lengthwise directions T1 to T4 are shown in FIG. 2 and described in following non-limiting example embodiments, but non-limiting example embodiments of the invention are not limited thereto.

Striped stains caused by a crystallization method using laser beams may result from a difference in electron mobility between the semiconductor layers 230 of the driving transistors TRd oriented in a direction perpendicular or parallel to a laser irradiation direction. This may be due to speckles caused in major and minor axes of linear laser beams due to high-interference characteristics of the laser beams. Thus, when specific dispersion is induced by allowing the driving transistors TRd of the two adjacent pixels to extend in different lengthwise directions T1 to T4, a variance in luminance with respect to the difference in electron mobility (to the linear beams) may be reduced, thereby lessening striped stains.

Here, since striped stains may occur in one or both of directions perpendicular or parallel to a laser irradiation direction, the driving transistors TRd of all (or substantially all) pairs of adjacent pixels located along the scan lines S1 to Sn and the data lines D1 to Dm may be formed to extend in different lengthwise directions T1 to T4.

In similar fashion, semiconductor layers 220 of the switching transistors TRs located in two adjacent pixels located along the scan lines S1 to Sn or the data lines D1 to Dm may be formed to extend in different lengthwise directions. However, more area (e.g., a predetermined area) may be required in order to allow both the semiconductor layers 220 and 230 of the two adjacent pixels to extend in different lengthwise directions. As a result, pixel circuits may be complicated, and emission areas may be reduced. Therefore, in some non-limiting example embodiments, only the semiconductor layers 230 of the driving transistors TRd, which are located in adjacent pixels and configured to generate driving currents that corresponds to the data signals, may be formed to extend in different lengthwise directions T1 to T4.

As a difference in electron mobility between the driving transistors TRd of adjacent pixels located along the scan lines S1 to Sn or the data lines D1 to Dm increases, striped stains may decrease. As shown in the following Equation 1, the difference in electron mobility between the semiconductor layers 230 of the two adjacent pixels is a function of angle differences of angles θ1 to θ4 between the lengthwise directions T1 to T4 in which the semiconductor layers 230 of the driving transistors TRd of the two adjacent pixels extend. Therefore, to increase the difference in electron mobility between adjacent semiconductor layers, the angle differences of the angles θ1 to θ4 between the lengthwise directions T1 to T4 in which the semiconductor layers 230 of the driving transistors TRd of the two adjacent pixels extend should be chosen to increase the corresponding values of Equation 1.

However, when the angle differences of the angles θ1 to θ4 between the lengthwise directions T1 to T4 in which the semiconductor layers 230 of the driving transistors TRd of the two adjacent pixels extend are changed, luminance nonuniformity may take place. Accordingly, in some non-limiting example embodiments, the angle differences of the angles θ1 to θ4 between the lengthwise directions T1 to T4 in which the semiconductor layers 230 of the driving transistors TRd of the two adjacent pixels extend may be constant (or substantially constant).

$$M_d = CW\left(\frac{1}{\cos\theta_1} - \frac{1}{\cos\theta_2}\right) \qquad (1)$$
$$= CW\left(\frac{\cos\theta_2 - \cos\theta_1}{\cos\theta_1 \cos\theta_2}\right),$$

where Md denotes a difference in electron mobility between two adjacent pixels, W denotes the width of the semiconductor layer of the driving transistor, and θ1 and θ2 denote the respective angles of the lengthwise directions in which the semiconductor layers of the driving transistors of the two adjacent pixels extend, which are measured based on a line parallel to the scan line as shown in FIG. 2.

Figure 3:
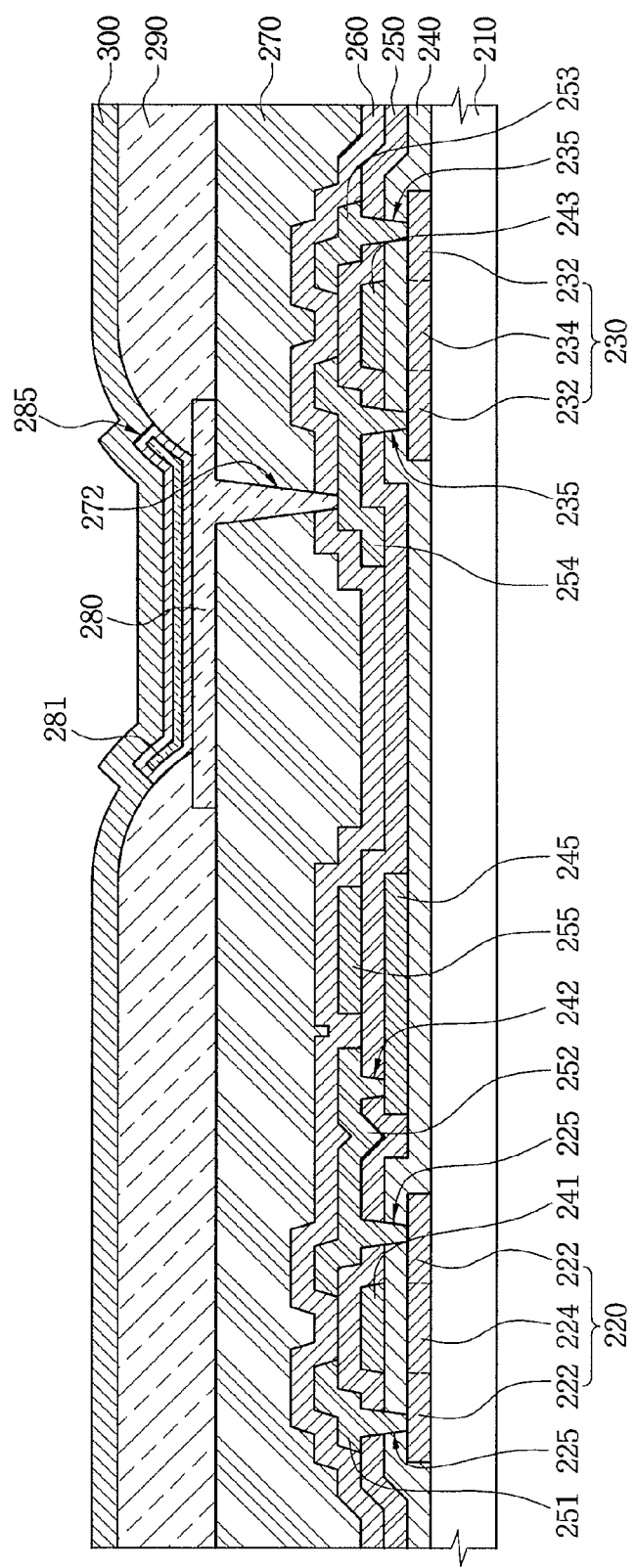
FIG. 3 is a cross-sectional view taken along line I-I' of FIG. 2.

FIG. 3 is a cross-sectional view taken along the line I-I' of FIG. 2.

A method of fabricating an OLED display device according to a non-limiting example embodiment of the present invention will now be described with reference to FIGS. 2 and 3.

Initially, an amorphous silicon (a-Si) layer (not shown) may be stacked on a substrate 210 formed using glass or synthetic resin, or steel use stainless (SUS, e.g., stainless steel). The a-Si layer may be crystallized into a polycrystalline silicon (poly-Si) layer by a crystallization method using a laser. The crystallization method using a laser may be an excimer laser annealing (ELA) crystallization method or a sequential lateral solidification (SLS) crystallization method. The poly-Si layer may be patterned, thereby forming a first semiconductor layer 220 of a switching transistor TRs and a second semiconductor layer 230 of a driving transistor TRd.

In this case, the second semiconductor layers 230 of the driving transistors TRd may extend in lengthwise directions (e.g., predetermined lengthwise directions) T1 to T4, and the semiconductor layers 230 of the driving transistors TRd of two adjacent pixels located along the scan line S1 to Sn or the data lines D1 to Dm may be formed to extend in different lengthwise directions T1 to T4. This may lead to variance between the characteristics of the driving transistors TRd of the two adjacent pixels located along the scan lines S1 to Sn or the data lines D1 to Dm.

Also, when an angle (e.g., a predetermined angle) is formed between the substrate 210 and laser beams (not shown) irradiated onto the substrate 210 in order to crystallize the first semiconductor layer 220 of the switching transistor TRs and the second semiconductor layer 230 of the driving transistor TRd, in view of productivity reductions of the manufacturing process, such as an increase in process time, the laser beams may be irradiated parallel to one lateral surface of the substrate 210. Generally, the scan lines S1 to Sn and the data lines D1 to Dm are formed parallel to one lateral surface of the substrate 210. Thus, for example, laser beams irradiated onto the substrate 210 in order to crystallize the first semiconductor layer 220 of the switching transistor TRs and the second semiconductor layer 230 of the driving transistor TRd may be irradiated in a direction parallel to the scan lines S1 to Sn or the data lines D1 to Dm. Consequently, the first semiconductor layer 220 of the switching transistor TRs and the second semiconductor layer 230 of the driving transistor TRd may be formed using a poly-Si layer in which crystal grain boundaries are formed in a direction parallel to the scan lines S1 to Sn or the data lines D1 to Dm.

Although the present non-limiting example embodiment as illustrated in FIG. 3 describes that an a-Si layer is directly formed on the substrate 210, in other non-limiting example embodiments, in order to prevent diffusion of impurities into the substrate 210 during the crystallization of the a-Si layer, a buffer layer (not shown) may be formed on the substrate 210, and the a-Si layer may be formed on the buffer layer and then crystallized. The buffer layer may be formed using a silicon nitride ($SiN_x$) layer, a silicon oxide ($SiO_2$) layer, or a stack layer thereof.

Continuing with the non-limiting example embodiment shown in FIG. 3, a gate insulating layer 240 may be stacked on the substrate 210 having the first and second semiconductor layers 220 and 230. The gate insulating layer 240 may be formed using a silicon oxide ($SiO_2$) layer, a silicon nitride ($SiN_x$) layer, or a stack layer thereof.

Afterwards, a metal layer (not shown) for a gate electrode may be formed on the gate insulating layer 240. The metal layer may be a single layer formed using aluminum (Al) or an Al alloy, such as aluminum-neodymium (Al—Nd), or a stack layer formed by stacking an Al alloy on a chromium (Cr) or molybdenum (Mo) alloy. The metal layer for the gate electrode may be dry or wet etched, thereby forming a first gate electrode 241, a second gate electrode 243, and a capacitor lower electrode 245 of the capacitor Cst. The first gate electrode 241 may correspond to a region (e.g., a predetermined region) of the first semiconductor layer 220 and be coupled to one of the scan lines S1 to Sn. The second gate electrode 243 may correspond to a region (e.g., a predetermined region) of the second semiconductor layer 230. Here, the regions of the first and second semiconductor layers 220 and 230 may be channel regions 224 and 234, respectively.

FIG. 2 illustrates that the first gate electrode 241 is in contact with one of the scan lines S1 to Sn and the second gate electrode 243 is in contact with the capacitor lower electrode 245. However, in other non-limiting example embodiments, after the first gate electrode 241, the scan lines S1 to Sn, the second gate electrode 243, and the capacitor lower electrode 245 are formed, the first gate electrode 241 and the scan lines S1 to Sn may be coupled to each other by contact holes, and the second gate electrode 243 and the capacitor lower electrode 245 may be coupled to each other by contact holes.

Next, portions of the first and second semiconductor layers 220 and 230 may be doped with conductive impurities using the first and second gate electrodes 241 and 243 as masks, thereby forming first source and drain regions 222 of the first semiconductor layer 220 and second source and drain regions 232 of the second semiconductor layer 230. Thus, the channel region 224 of the first semiconductor layer 220 may be formed between the first source and drain regions 222 of the first semiconductor layer 220, and the channel region 234 of the second semiconductor layer 230 may be formed between the second source and drain regions 232 of the second semiconductor layer 230. In this case, the impurity doping process may be performed by forming photoresist on the substrate 210 before forming the first and second gate electrodes 241 and 243. In other non-limiting example embodiments, in order to prevent a leakage current, the impurity doping process may be performed by doping low-concentration impurities into portions of the channel region 224 of the first semiconductor layer 220 and the channel region 234 of the second semiconductor layer 230.

Subsequently, an interlayer insulating layer 250 may be formed on the substrate 210 having the first and second gate electrodes 241 and 243. The interlayer insulating layer 250 and the gate insulating layer 240 may be etched, thereby forming first, second, and third contact holes 225, 235, and 242. The first contact hole 225 may partially expose the first source and drain regions 222, the second contact hole 235 may partially expose the second source and drain regions 232, and the third contact hole 242 may partially expose the lower capacitor electrode 245.

Thereafter, a conductive material, such as moly-tungsten (MoW) or aluminum-neodymium (Al—Nd), may be stacked on the interlayer insulating layer 250 having the first through third contact holes 225, 235, and 242. The conductive material may be patterned to form first source/drain electrode 251, second source/drain electrode 252, third source/drain electrode 253, fourth source/drain electrode 254, and a capacitor upper electrode 255, thereby completing the switching transistor TRs, the driving transistor TRd, and the capacitor Cst.

The first and second source/drain electrodes 251 and 252 may be coupled to the first source and drain regions 222 through the first contact holes 225. The first source/drain electrode 251 may be coupled to one of the data lines D1 to Dm. The second source/drain electrode 252 may be coupled to the capacitor lower electrode 245 through the third contact hole 242.

The third and fourth source/drain electrodes 253 and 254 may be coupled to the second source/drain regions 232 through the second contact holes 235. The third source/drain electrode 253 may be coupled to the power voltage supply line ELVDD. The fourth source/drain electrode 254 may be coupled to a lower electrode 280 that is formed during a subsequent process.

Although the present non-limiting example embodiment as illustrated in FIG. 3 describes that each pixel includes one switching transistor TRs, one driving transistor TRd, and one capacitor Cst, in other non-limiting example embodiments, when each pixel includes a compensation circuit configure to compensate for a threshold voltage of the driving transistor TRd, the pixel may further include a plurality of switching transistors TRs.

Furthermore, although the present non-limiting example embodiment as illustrated in FIG. 3 describes that each of the switching transistor TRs and the driving transistor TRd has a top-gate structure in which a gate electrode is positioned on a semiconductor layer, in other non-limiting example embodiments, the switching transistor TRs and the driving transistor TRd may have different structures. For example, the switching transistor TRs or the driving transistor TRd may have a bottom-gate structure in which a gate electrode is positioned under a semiconductor layer.

Next, a protection layer 260 and a planarization layer 270 may be formed on the substrate 210 including the first through fourth source/drain electrodes 251, 252, 253, and 254 and etched, thereby forming a via hole 272 partially exposing the fourth source/drain electrode 254. The protection layer 260 may be an inorganic insulating layer, such as a silicon oxide layer. The planarization layer 270 may be an organic insulating layer, such as an acryl layer. Although the present non-limiting example embodiment as illustrated in FIG. 3 describes that both the protection layer 260 and the planarization layer 270 are formed on the substrate 210 having the first through fourth source/drain electrodes 251, 252, 253, and 254, in other non-limiting example embodiments, only one of the protection layer 260 and the planarization layer 270 may be formed.

Thereafter, a conductive material may be stacked on the planarization layer 270 having the via hole 272 and patterned, thereby forming the lower electrode 280 to be coupled to the fourth source/drain electrode 254 through the via hole 272. Afterwards, a pixel-defining layer 290 defining an emission region may be formed on the substrate 210 having the lower electrode 280, to partially expose the lower electrode 280. The pixel-defining layer 290 may be formed using polyimide, benzocyclobutens series resin, phenol resin, acrylate, or a mixture thereof.

Subsequently, an organic layer 285 including at least one emission layer (EML) 281 may be formed on the surface of the lower electrode 280 exposed by the emission region (i.e., pixel-defining layer 290) defined by the pixel-defining layer 290. An upper electrode 300 may be formed on the organic layer 285, thereby completing the OLED configured to emit light of a color (e.g., a predetermined color) that corresponds to a data signal and a scan signal.

As a result, the driving transistors TRd of two adjacent pixels located along the scan lines S1 to Sn or the data lines D1 to Dm may have semiconductor layers extending in different lengthwise directions. Thus, variance occurs between the driving transistors TRd, thereby reducing striped stains due to output nonuniformity of oscillation laser beams.

According to non-limiting example embodiments of the present invention as described above, semiconductor layers of driving transistors located in two adjacent pixels located along scan lines or data lines may be formed to extend in different lengthwise directions, thereby bringing about variance between the characteristics of the driving transistors of the two adjacent pixels. As a result, striped stains due to output nonuniformity of oscillation laser beams may be reduced without degrading productivity of the manufacturing process.

Although the present invention has been described with reference to certain non-limiting example embodiments thereof, it will be understood by those skilled in the art that a variety of modifications and variations may be made to the non-limiting example embodiments of the present invention without departing from the spirit or scope of the present invention defined in the appended claims and their equivalents.

What is claimed is:

1. A method of fabricating an organic light emitting diode (OLED) display device comprising a substrate, a plurality of data lines, a plurality of scan lines, and a plurality of pixels at crossing regions of the data lines and the scan lines, the pixels comprising a first pixel, a second pixel adjacent to the first pixel in a scan line direction, and a third pixel adjacent to the first pixel in a data line direction, the method comprising:
   forming a switching transistor and a driving transistor on the substrate for each of the pixels, wherein the switching transistor comprises a first semiconductor layer, a first gate insulating layer, first and second source/drain electrodes, and a first gate electrode, and the driving transistor comprises a second semiconductor layer, a second gate insulating layer, third and fourth source/drain electrodes, and a second gate electrode;
   forming each of the scan lines coupled to the first gate electrode of the switching transistor of respective pixels from among the plurality of pixels, and each of the data lines coupled to the first source/drain electrode of the switching transistor of respective pixels from among the plurality of pixels;
   forming a protection layer on the switching transistor and the driving transistor of each of the pixels; and
   forming, for each of the pixels, an OLED on the protection layer, the OLED comprising a lower electrode coupled to the fourth source/drain electrode of the driving transistor, an organic layer comprising at least one emission layer (EML), and an upper electrode,
   wherein the second semiconductor layers of the first pixel, the second pixel, and the third pixel extend in different lengthwise directions.

2. The method according to claim 1, wherein the first and second semiconductor layers are formed by crystallizing amorphous silicon (a-Si) into polycrystalline silicon (poly-Si) using laser beams, and the laser beams used to crystallize the a-Si are irradiated in a direction parallel to the scan lines or the data lines.

3. The method according to claim 1, wherein angle differences between the lengthwise directions of the second semiconductor layers of any two adjacent pixels in the scan line direction or the data line direction having different lengthwise directions from among the plurality of pixels are substantially the same as each other.

4. The method according to claim 3, wherein the second semiconductor layers of substantially any two adjacent pixels in the scan line direction or the data line direction from among the plurality of pixels extend in different lengthwise directions.

5. The method according to claim 1, further comprising forming a planarization layer on the protection layer.

6. The method according to claim 1, wherein
   each of the first and second semiconductor layers comprises source and drain regions, and a channel region,
   each of the first and second gate electrodes is in a location corresponding to the channel region of the first and second semiconductor layers, respectively,
   the first and second source/drain electrodes are coupled to the source and drain regions of the first semiconductor layer, in some order,
   the third and fourth source/drain electrodes are coupled to the source and drain regions of the second semiconductor layer, in some order,
   the first gate insulating layer is between the first semiconductor layer and the first gate electrode, and
   the second gate insulating layer is between the second semiconductor layer and the second gate electrode.

7. The method according to claim 1, wherein the switching transistor and the driving transistor have substantially the same structure.

8. The method according to claim 1, wherein the second semiconductor layers of substantially any two adjacent pixels in the scan line direction or the data line direction from among the plurality of pixels extend in different lengthwise directions.

9. A method of fabricating an organic light emitting diode (OLED) display device comprising a plurality of pixels located at crossing regions of a plurality of data lines through which data signals are transmitted from a data driver and a plurality of scan lines through which scan signals are transmitted from a scan driver, the pixels comprising a first pixel, a second pixel adjacent to the first pixel in a scan line direction, and a third pixel adjacent to the first pixel in a data line direction, the method comprising:

forming a plurality of thin film transistors (TFTs) for each of the pixels, each of the TFTs comprising a semiconductor layer, a gate insulating layer, source and drain electrodes, and a gate electrode;

forming the scan lines in the scan line direction;

forming the data lines in the data line direction; and forming an OLED controlled by a respective said plurality of TFTs for each of the pixels, wherein the semiconductor layers of the TFTs coupled to the OLEDs of the first pixel, the second pixel, and the third pixel extend in different lengthwise directions.

10. The method according to claim 9, wherein each of the pixels further comprises:

a capacitor configured to store a data signal from among the data signals;

a driving transistor from among the TFTs configured to apply a driving current to the OLED that corresponds to the data signal; and a switching transistor from among the TFTs configured to apply the data signal to a gate terminal of the driving transistor in response to one of the scan signals, wherein the semiconductor layers of the driving transistors of two adjacent pixels in the scan line direction or the data line direction from among the plurality of pixels extend in different lengthwise directions.

11. The method according to claim 9, wherein angle differences between the lengthwise directions of the semiconductor layers of the TFTs coupled to the OLEDs of any two adjacent pixels in the scan line direction or the data line direction having different lengthwise directions from among the plurality of pixels are substantially the same as each other.

12. The method according to claim 11, wherein the semiconductor layers of the TFTs coupled to the OLEDs of substantially any two adjacent pixels in the scan line direction or the data line direction from among the plurality of pixels extend in different lengthwise directions.

13. The method according to claim 9, wherein the semiconductor layers of the TFTs are formed using polycrystalline silicon crystallized using laser beams.

14. The method according to claim 13, wherein the semiconductor layers of the TFTs have crystal grain boundaries formed parallel to the scan lines or the data lines.

15. The method according to claim 9, wherein the semiconductor layers of the TFTs coupled to the OLEDs of substantially any two adjacent pixels in the scan line direction or the data line direction from among the plurality of pixels extend in different lengthwise directions.

16. A method of fabricating an organic light emitting diode (OLED) display device comprising a plurality of scan lines extending in a major axis direction, a plurality of data lines crossing the scan lines in a minor axis direction, and a plurality of pixels at crossing regions of the scan lines and the data lines, the method comprising:

forming a switching transistor for each of the pixels, the switching transistor comprising a gate electrode coupled to one of the scan lines and a first electrode coupled to one of the data lines;

forming a driving transistor for each of the pixels, the driving transistor being coupled between an OLED and a power voltage supply line, and comprising a semiconductor layer and a gate electrode coupled to a second electrode of the switching transistor;

forming the scan lines in the major axis direction;

forming the data lines in the minor axis direction;

forming a capacitor for each of the pixels, the capacitor being coupled between the gate electrode of the driving transistor and the power voltage supply line; and forming the OLED for each of the pixels, wherein a lengthwise direction of the semiconductor layer of the driving transistor of each of three adjacent ones of the plurality of pixels in the major axis direction is offset from the major axis direction and the minor axis direction.

17. The method of claim 16, wherein the lengthwise direction of the semiconductor layer of the driving transistor of each of the three adjacent ones of the plurality of pixels in the major axis direction comprise three different lengthwise directions.

18. The method of claim 17, wherein a pattern of the three different lengthwise directions repeats in other adjacent ones of the plurality of pixels in the major axis direction.

19. The method of claim 16, wherein lasers for forming the semiconductor layer in the driving transistor of the pixels are irradiated in the major axis direction or the minor axis direction.

20. The method of claim 16, wherein the three adjacent ones of the plurality of pixels comprise a red pixel, a green pixel, and a blue pixel.

* * * * *